US012598707B2

(12) United States Patent
Lee et al.

(10) Patent No.:    US 12,598,707 B2
(45) Date of Patent:         Apr. 7, 2026

(54) METHOD OF MANUFACTURING MULTI-LAYER CIRCUIT BOARD INCLUDING EXTREME FINE VIA AND MULTI-LAYER CIRCUIT BOARD MANUFACTURED BY THE SAME

(71) Applicant: TSE CO., LTD, Chungcheongnam-do (KR)

(72) Inventors: Byeong Yong Lee, Chungcheongnam-do (KR); Eun Ha Park, Chungcheongnam-do (KR); Weon Bin Jang, Chungcheongnam-do (KR); Gun Won Seo, Chungcheongnam-do (KR); Kum Sun Park, Chungcheongnam-do (KR); Chung Hyeon Kim, Chungcheongnam-do (KR)

(73) Assignee: TSE CO., LTD., Cheonan-si (KR)

( * ) Notice: Subject to any disclaimer, the term of this patent is extended or adjusted under 35 U.S.C. 154(b) by 645 days.

(21) Appl. No.: 17/984,032

(22) Filed: Nov. 9, 2022

(65) Prior Publication Data

US 2023/0147650 A1      May 11, 2023

(30) Foreign Application Priority Data

Nov. 10, 2021    (KR) ........................ 10-2021-0153808

(51) Int. Cl.
  *H05K 3/42*          (2006.01)
  *H05K 3/26*          (2006.01)
  *H05K 3/46*          (2006.01)
(52) U.S. Cl.
  CPC .............. H05K 3/424 (2013.01); H05K 3/26 (2013.01); H05K 3/429 (2013.01); H05K 3/4623 (2013.01);
        (Continued)

(58) Field of Classification Search
  CPC .......... H05K 3/424; H05K 3/26; H05K 3/429; H05K 3/4623; H05K 2203/0723;
        (Continued)

(56)                References Cited

U.S. PATENT DOCUMENTS 6,022,466  A  *  2/2000  Tamarkin ............... H05K 3/429
                                                           205/920
6,123,088  A  *  9/2000  Ho ........................... H05K 3/26
                                                           438/692
        (Continued)

FOREIGN PATENT DOCUMENTS

CN        101309558  A      11/2008
CN        101496227  A      7/2009
        (Continued)

OTHER PUBLICATIONS

Stockmeier et al., "SKiN: Double side sintering technology for new packages", 2011 IEEE 23rd International Symposium on Power Semiconductor Devices and ICs, San Diego, CA, USA, 2011, pp. 324-327. (Year: 2011).*
        (Continued)

*Primary Examiner* — A. Dexter Tugbang
(74) *Attorney, Agent, or Firm* — Crowell & Moring LLP

(57)                ABSTRACT

A method for manufacturing a multi-layer circuit board including an extreme fine that may include: providing a board having one surface on at least a part of which an upper conductive layer is formed and the other surface on at least a part of which a lower conductive layer is formed; forming a lower metal layer on the other surface of the board; forming a first resist layer on the one surface of the board through a photolithography process, and forming a first opening on the first resist layer; forming a metal pillar by plating the first opening by using an electrolytic plating method; removing the first resist layer; forming an insulating layer on a location from which the first resist layer is
        (Continued)

removed; and evenly polishing the metal pillar and the insulating layer.

13 Claims, 4 Drawing Sheets

(52) U.S. Cl.
　　CPC ................ *H05K 2203/0415* (2013.01); *H05K 2203/0502* (2013.01); *H05K 2203/0588* (2013.01); *H05K 2203/0723* (2013.01)

(58) Field of Classification Search
　　CPC ... H05K 2203/0502; H05K 2203/0588; H05K 2203/0415; H01L 23/49827
　　See application file for complete search history.

(56) References Cited

U.S. PATENT DOCUMENTS

| 7,635,641 | B2 | | 12/2009 | Hurwitz et al. |
| 8,598,698 | B1 | * | 12/2013 | Lim .................. H01L 23/49827 |
| | | | | 257/E23.068 |
| 8,816,218 | B2 | | 8/2014 | Hurwitz |
| 2007/0082501 | A1 | | 4/2007 | Hurwitz et al. |
| 2013/0319747 | A1 | | 12/2013 | Hurwitz |
| 2022/0279662 | A1 | | 9/2022 | Reents et al. |

FOREIGN PATENT DOCUMENTS

| JP | 2015065376 | A | * | 4/2015 |
| KR | 10-2009-0086832 | A | | 8/2009 |
| KR | 10-2142803 | B1 | | 8/2020 |
| TW | 201404267 | A | | 1/2014 |
| TW | 202114501 | A | | 4/2021 |

OTHER PUBLICATIONS

Office Action dated Jul. 6, 2023 (23 pages including English translation) out of corresponding Taiwanese Application 11220658330.
Office Action dated Aug. 17, 2023 (13 pages including English translation) out of corresponding Korean application 10-2021-0153808.

* cited by examiner

PROVIDE BOARD 105 ON WHICH UPPER CONDUCTIVE LAYER 115 AND LOWER CONDUCTIVE LAYER 120 ARE FORMED — S101

FORM LOWER METAL LAYER 125 — S102

FORM FIRST RESIST LAYER 130 AND FIRST OPENING 135 THROUGH PHOTOLITHOGRAPHY PROCESS — S103

FORM METAL PILLAR 140 — S104

REMOVE FIRST RESIST LAYER 130 — S105

FORM INSULATING LAYER 145 — S106

PERFORM CHEMICAL MECHANICAL POLISHING — S107

FIG. 2

METHOD OF MANUFACTURING MULTI-LAYER CIRCUIT BOARD INCLUDING EXTREME FINE VIA AND MULTI-LAYER CIRCUIT BOARD MANUFACTURED BY THE SAME

CROSS-REFERENCE TO RELATED APPLICATION

This application is based on and claims priority under 35 U.S.C. § 119 to Korean Patent Application No. 10-2021-0153808 filed on Nov. 10, 2021, in the Korean Intellectual Property Office, the disclosure of which is herein incorporated by reference in its entirety.

BACKGROUND

Field

An embodiment of the disclosure relates to a method for manufacturing a multi-layer circuit board including an extreme fine via and a multi-layer circuit board manufactured by the same.

Description of Related Art

A method for manufacturing a multi-layer circuit board in the related art includes an insulating layer bonding process, a laser drilling process, and an electrolytic plating process in order to form a via inside a circuit board. For example, in the manufacturing method in the related art, the insulating layer is bonded to an upper part of the board through thermal compression bonding. In the manufacturing method in the related art, after the insulating layer is bonded to the upper part of the board, a via is formed on an inside of the insulating layer by using a laser drill. In the manufacturing method in the related art, after the via is formed by using the laser drill, an inside of the via is plated through the electrolytic plating process.

SUMMARY

According to the method for manufacturing the multi-layer circuit board in the related art, it is difficult to form an extreme fine via due to limitations of process capability using a laser drill.

According to the method for manufacturing the multi-layer circuit board in the related art, it is difficult to implement a fine pitch (e.g., interval between via centers included in the multi-layer circuit board) due to the limitations of the process capability using the laser drill.

According to various embodiments of the disclosure, a method for manufacturing a multi-layer circuit board including an extreme fine via and a multi-layer circuit board manufactured by the method are provided to provide a multi-layer circuit board on which an extreme fine via and a fine pitch are implemented.

According to an embodiment of the disclosure, a method for manufacturing a multi-layer circuit board including an extreme fine via may include: providing a board having one surface on at least a part of which an upper conductive layer is formed and the other surface on at least a part of which a lower conductive layer is formed; forming a lower metal layer on the other surface of the board; forming a first resist layer on the one surface of the board through a photolithography process, and forming a first opening on the first resist layer; forming a metal pillar by plating the first opening by using an electrolytic plating method; removing the first resist layer; forming an insulating layer on a location from which the first resist layer is removed; and evenly polishing the metal pillar and the insulating layer.

According to an embodiment of the disclosure, a multi-layer circuit board including an extreme fine via may be manufactured by a method for manufacturing a multi-layer circuit board, which includes: providing a board having one surface on at least a part of which an upper conductive layer is formed and the other surface on at least a part of which a lower conductive layer is formed; forming a lower metal layer on the other surface of the board; forming a first resist layer on the one surface of the board through a photolithography process, and forming a first opening on the first resist layer; forming a metal pillar by plating the first opening by using an electrolytic plating method; removing the first resist layer; forming an insulating layer on a location from which the first resist layer is removed; and evenly polishing the metal pillar and the insulating layer.

According to the method for manufacturing the multi-layer circuit board including the extreme fine via and the multi-layer circuit board manufactured by the method according to an embodiment of the disclosure, it is possible to provide the multi-layer circuit board including the extreme fine via by the method for forming the metal pillar through the photolithography process.

According to the method for manufacturing the multi-layer circuit board including the extreme fine via and the multi-layer circuit board manufactured by the method according to an embodiment of the disclosure, it is possible to provide the multi-layer circuit board on which the fine pitch (e.g., the interval between the via centers) is implemented by the method for forming the metal pillar through the photolithography process.

Since the method for manufacturing the multi-layer circuit board including the extreme fine via according to an embodiment of the disclosure is the method for forming the fine via through convergence of the via forming process in the related art and the photolithography process, it is possible to provide the multi-layer circuit board including the extreme fine via even without separate equipment investment.

BRIEF DESCRIPTION OF THE DRAWINGS

FIG. 2 is an explanatory view illustrating a process for planarization of an insulating layer and a metal pillar through a chemical mechanical polishing process according to an embodiment of the disclosure.

DETAILED DESCRIPTION

Figure 1A:
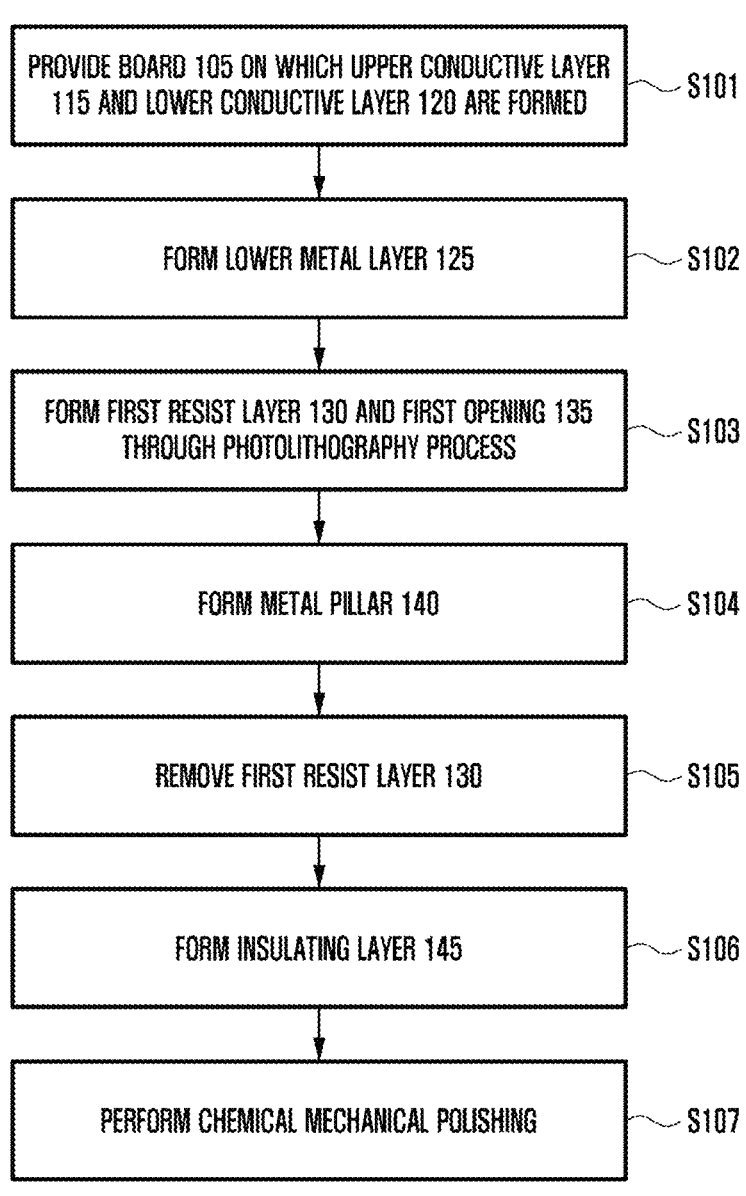
FIGS. 1A and 1B area flowchart and an explanatory diagram illustrating a method for manufacturing a multi-layer circuit board including an extreme fine via according to an embodiment of the disclosure.

FIG. 1A is a flowchart illustrating a process of forming a first opening 135 and an insulating layer 145 of a multi-layer circuit board 100 including an extreme fine via according to an embodiment of the disclosure.

Figure 1B:
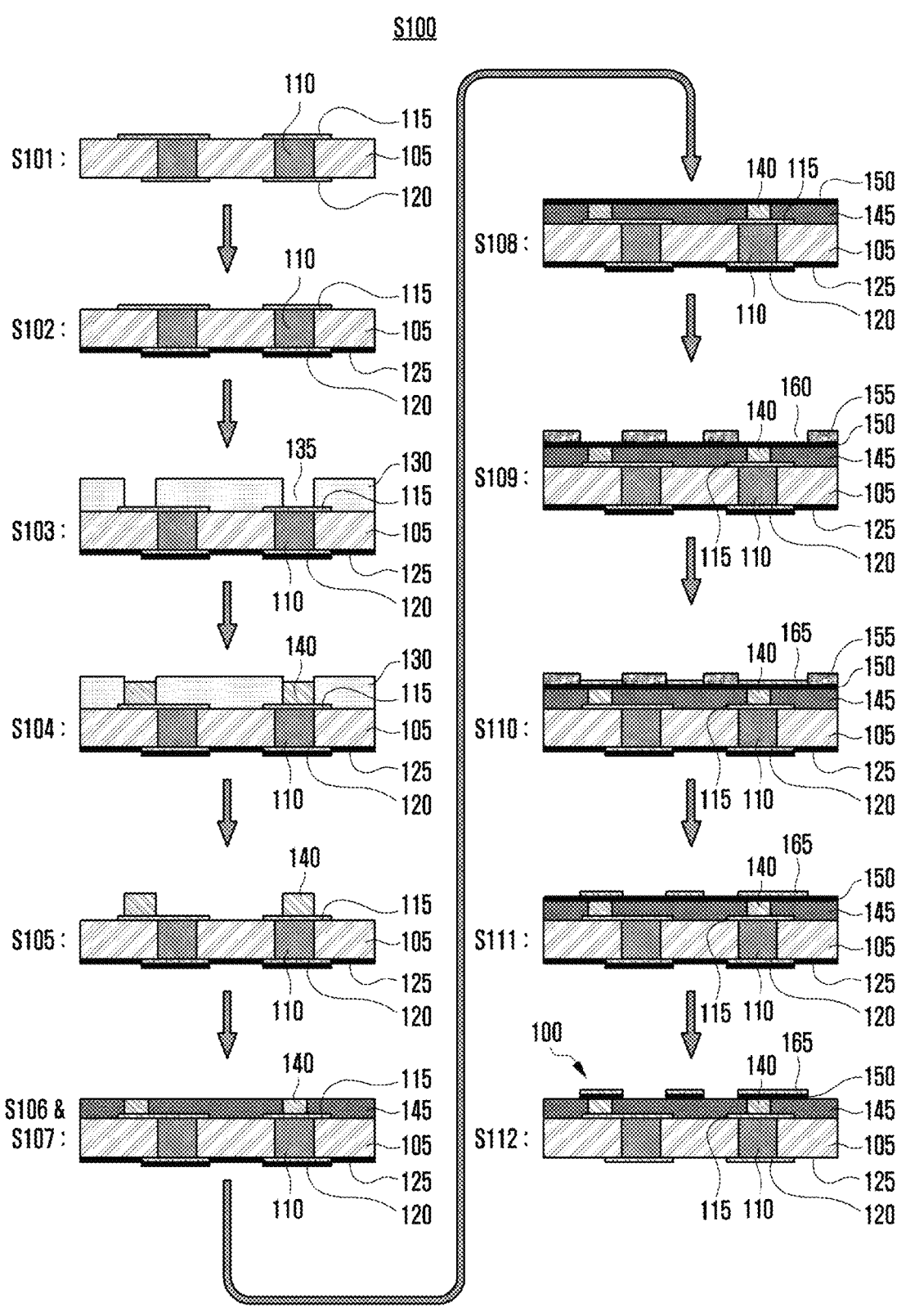

FIG. 1B is an explanatory view illustrating a method for manufacturing a multi-layer circuit board including an extreme fine via according to an embodiment of the disclosure.

In explaining an embodiment of the disclosure, an extreme fine via may mean a via formed with a fine diameter. For example, the extreme fine via may mean a via formed with a diameter of less than 25 μm.

With reference to FIGS. 1A and 1B, a method for manufacturing a multi-layer circuit board including an extreme fine via may include: providing a board 105 on which an upper conductive layer 115 and a lower conductive layer 120 are formed (S101); forming a lower metal layer 125 (S102); forming a first resist layer 130 on the one surface of the board 105 through a photolithography process, and forming a first opening 135 on the first resist layer 130 (S103); forming a metal pillar 140 on the first opening 135 (S104); removing the first resist layer 130 (S105); forming an insulating layer 145 on a location from which the first resist layer 130 is removed (S106); and evenly polishing the metal pillar 140 and the insulating layer 145 (S107).

At operation S101, the board 105 on which the upper conductive layer 115 and the lower conductive layer 120 are formed may be provided. The board 105 may be a pre-made product.

In explaining the multi-layer circuit board 100 including the extreme fine via according to an embodiment of the disclosure, one surface of the board 105 may mean an upper surface of the board 105, and the other surface of the board 105 may mean a lower surface of the board 105.

With reference to FIG. 1B, the upper conductive layer 115 and the lower conductive layer 120 may be located on at least parts of the board 105. The upper conductive layer 115 may be formed on at least a part of one surface (e.g., upper surface of the board 105) of the board 105. The lower conductive layer 120 may be formed on at least a part of the other surface (e.g., lower surface of the board 105) of the board 105.

According to an embodiment of the disclosure, the upper conductive layer 115 and the lower conductive layer 120 may include a conductive material. The upper conductive layer 115 and the lower conductive layer 120 may be made of any one metal of copper, nickel, and gold, or alloys thereof, and it may be preferable that they are made of copper in comprehensive consideration of electrical conductivity, durability, and economical efficiency thereof.

According to an embodiment of the disclosure, the upper conductive layer 115 and the lower conductive layer 120 may be formed through a photolithography process, a plating process, and an etching process. For example, patterns of the upper conductive layer 115 and the lower conductive layer 120 may be formed through the photolithography process, and the upper conductive layer 115 and the lower conductive layer 120 may be formed by a material having electrical conductivity through the plating process. After the upper conductive layer 115 and the lower conductive layer 120 are formed, a photosensitive layer (not illustrated) having been used in the photolithography process may be removed through the etching process.

With reference to FIG. 1B, the board 105 may include a via hole 110 formed on at least a part of the board. The via hole 110 may be connected to the upper conductive layer 115 at one end of the via hole 110, and may be connected to the lower conductive layer 120 at the other end of the via hole 110. The via hole 110 may serve to electrically connect the upper conductive layer 115 and the lower conductive layer 120 to each other.

According to an embodiment of the disclosure, a plurality of via holes 110 may be formed on an inside of the board 105. Although FIG. 1B illustrates that two via hole 110 are formed on the inside of the board 105, the number of via holes 110 is not limited thereto, and two or a plurality of via holes may be formed.

According to an embodiment of the disclosure, a part of the via hole 110 may be formed through a mechanical drilling process, and the remaining part of the via hole 110 may be formed through a laser process. The plurality of via holes 110 may be formed on the inside of the board 105.

According to an embodiment of the disclosure, at least a part of the via hole 110 may be filled with a conductive material. For example, the via hole 110 may be in the form in which only an inner wall of the via hole 110 is plated by a conductive material and the remaining empty space is filled with a non-conductive material, or may be in the form in which all of the inside of the via hole 110 is filled with a conductive material.

At operation S102, the lower metal layer 125 may be formed on the other surface (e.g., lower surface of the board 105) of the board 105. The lower metal layer 125 may be a layer formed to make the metal pillar 140 in an electrolytic plating method.

With reference to FIG. 1B, the lower metal layer 125 may be formed over the whole of the other surface (e.g., lower surface of the board 105) of the board 105. Since the lower conductive layer 120 may be located on at least a part of the other surface of the board 105, the lower metal layer 125 may be formed so that at least a part of the lower metal layer 125 comes in contact with the lower conductive layer 120.

With reference to FIG. 1B, at operation S102, the lower conductive layer 120 may be disposed so that at least a part of the lower conductive layer 120 comes in contact with the via hole 110 and the lower metal layer 125. For example, the via hole 110 may be disposed on one surface (e.g., upper surface of the lower conductive layer 120) of the lower conductive layer 120, and the lower metal layer 125 may be disposed on the other surface (e.g., lower surface of the lower conductive layer 120) of the lower conductive layer 120.

According to an embodiment of the disclosure, the lower metal layer 125 may be formed by a sputtering process. The sputtering process is one of methods for forming a thin film on the surface of a target object, and forms the thin film by attaching and accumulating ions on the surface of the target object after accelerating and impacting the ions toward the target object on which the thin film is intended to be formed.

According to an embodiment of the disclosure, since the lower metal layer 125 is a layer for applying one pole of a power for plating at operation S104, it may include a material having electrical conductivity.

According to an embodiment of the disclosure, the lower metal layer 125 may be temporarily formed, and then may be removed at operation S112. Since the lower metal layer 125 may be removed at operation S112, it is preferable that the lower metal layer 125 has a thickness that is thinner than that of the lower conductive layer 120.

At operation S103, the first resist layer 130 may be formed on the other surface of the board 105 through the photolithography process. After the first resist layer 130 is formed, the first opening 135 may be formed on the first resist layer 130.

The photolithography process may include a resist forming process, an exposure process, and a development process. The resist forming process may include a process of forming the first resist layer 130 of which the chemical property may be changed by light. For example, in the resist forming process, the first resist layer 130, of which the characteristics may be changed to be easily hardened or melted when exposed to light, may be formed on the one surface (e.g., upper surface of the board 105) of the board 105. The first resist layer 130 may include a dry film photoresist and a deposition material for attaching the dry film photoresist.

The exposure process may include a process of selectively radiating the light onto the resist after covering the resist with a mask on which a pattern is formed. For example, in the exposure process, the light may be selectively radiated onto the first resist layer 130 after covering the first resist layer 130 with a mask on which a pattern representing the first opening 135 is formed. The pattern formed on the mask may be formed in accordance with a positive or negative method. The positive method is a method for removing an area that is exposed to the light through the mask, and the negative method is a method for removing an area that is not exposed to the light. The light may be radiated onto the area where the first opening 135 is formed or the area where the first opening 135 is not formed through the exposure process in accordance with the method of the pattern formed on the mask.

The development process is a process of selectively removing a part on which the light is radiated or a part on which the light is not radiated from the first resist layer 130 through a developer. An area corresponding to the first opening 135 may be selectively removed from the first resist layer 130 through the development process. The photolithography process may include an etching process for removing the remaining deposition material after the development process.

At operation S104, the metal pillar 140 may be formed on the first opening 135 by using the electrolytic plating method.

In an embodiment, in order to form the metal pillar 140 through the electrolytic plating method, one pole of the power for plating may be applied to the lower metal layer 125, and the other pole of the power for plating may be applied to a plating material side. For example, the metal pillar 140 may be formed in the electrolytic plating method in the form in which a cathode of the power for plating is applied to the lower metal layer 125 and an anode of the power for plating is applied to the plating material.

According to an embodiment of the disclosure, copper (Cu) may be used as the plating material composed of the metal pillar 140. It may be preferable that the metal pillar 140 is made of copper (Cu) in comprehensive consideration of electrical conductivity, durability, and economical efficiency thereof. The metal pillar 140 may be formed in the form of a copper (Cu) pillar made of copper (Cu).

With reference to FIG. 1B, the multi-layer circuit board 100 may include a plurality of metal pillars 140. Each of the plurality of metal pillars 140 may be formed on the location of the first opening 135. For example, the multi-layer circuit board 100 may include a plurality of first openings 135, and the metal pillar 140 may be formed on each of the plurality of first opening 135.

With reference to FIG. 1B, the metal pillar 140 may be connected to at least a part of the upper conductive layer 115. The metal pillar 140 and the upper conductive layer 115 may include a material having electrical conductivity, and may be electrically connected to each other.

In an embodiment, one surface of the upper conductive layer 115 may be an upper surface of the upper conductive layer 115, and the other surface of the upper conductive layer 115 may be a lower surface of the upper conductive layer 115. The metal pillar 140 may be located on the one surface (e.g., upper surface of the upper conductive layer

115) of the upper conductive layer 115. The via hole 110 may be located on the other surface (e.g., lower surface of the upper conductive layer 115) of the upper conductive layer 115.

At operation S105, the first resist layer 130 may be removed.

With reference to FIG. 1B, through operation S104, the metal pillar 140 may be formed on the location of the first opening 135, and at least a part of the first resist layer 130 may remain on the one surface (e.g., upper surface of the board 105) of the board 105. For example, the at least a part of the first resist layer 130 may be located around the metal pillar 140, and may remain on the one surface (e.g., upper surface of the board 105) of the board and the one surface (e.g., upper surface of the upper conductive layer 115) of the upper conductive layer 115.

At operation S105, the first resist layer 130 that remains on the one surface (e.g., upper surface of the board 105) of the board 105 may be removed. After the first resist layer 130 is removed, the metal pillar 140 may remain in the form in which the metal pillar 140 protrudes in a direction in which the metal pillar 140 gets far away from the one surface (e.g., upper surface of the board 105) of the board 105.

According to the method for forming the metal pillar 140 through operations S101 to S105, it is possible to form the via with a smaller diameter as compared with the method for forming the via by using a laser. For example, in case of forming the via by using a laser drill, it is difficult to form the via with the diameter of less than 25 μm, whereas in case of the method for forming the metal pillar 140 through operations S101 to S105, it is possible to form the via with the diameter of 14 μm to 25 μm.

With reference to FIG. 1B, at operation S105, a plurality of metal pillar 140 may be formed. The plurality of metal pillars 140 may be disposed at predetermined intervals.

According to the method for forming the plurality of metal pillars 140 through operations S101 to S105, it is possible to form vias with a smaller interval between via centers as compared with the method for forming a plurality of vias by using the laser. For example, in case of forming the plurality of vias by using the laser, it is difficult to form the vias with the interval between the via centers of less than 50 μm, whereas in case of the method for forming the plurality of metal pillars 140 through operations S101 to S105, it is possible to form the vias with the interval between the via centers of 30 μm to 50 μm.

According to the multi-layer circuit board 100 manufactured by the method for manufacturing the multi-layer circuit board 100 including the extreme fine via according to an embodiment of the disclosure, the plurality of metal pillars 140 with the diameter of 14 μm to 25 μm. The multi-layer circuit board 100 may be formed so that the interval between the centers of the plurality of metal pillars 140 becomes 30 μm to 50 μm.

At operation S106, the insulating layer 145 may be formed on the location from which the first resist layer 130 is removed.

With reference to FIG. 1B, the insulating layer 145 may be formed on the area on which the first resist layer 115 removed at operation S105 was located. For example, the insulating layer 145 may be formed on one surface of the board 105 and one surface of the upper conductive layer 115. The insulating layer 145 may be formed to wrap around the metal pillar 140.

According to an embodiment of the disclosure, the insulating layer 145 may include an insulating material. The insulating layer 145 may be formed by bonding the insulating material to the one surface (e.g., upper surface of the board 105) of the board 105 by hot press processing.

In an embodiment, the one surface of the insulating layer 145 may be the upper surface of the insulating layer 145, and the other surface of the insulating layer 145 may be the lower surface of the insulating layer 145. The one surface of the board 105 may be the upper surface of the board 105, and the other surface of the board 105 may be the lower surface of the board 105.

In an embodiment, the hot press processing may be performed in a manner that an external press device (not illustrated) is located on the one surface (e.g., upper surface of the insulating layer 145) of the insulating layer 145 and the other surface (e.g., lower surface of the board 105) of the board 105, and heat and pressure are applied toward the insulating layer 145.

At operation S107, the metal pillar 140 and the insulating layer 145 may be evenly formed by polishing.

In an embodiment, the metal pillar 140 and the insulating layer 145 may be evenly formed by being polished through chemical mechanical polishing (CMP).

The chemical mechanical polishing (CMP) may include a process of inducing a chemical reaction by dispersing slurry including a fine abrasive on a pad. The chemical mechanical polishing (CMP) may include a mechanical polishing process in which the surface that requires a planarization process is located on the pad, and then the pad is rotated with pressure.

At operation S107, the metal pillar 140 and the insulating layer 145 may be evenly formed as relatively protruded parts are polished with a high pressure through the chemical mechanical polishing. At least a part of the insulating layer 145 that surrounds the metal pillar 140 may be removed through the chemical mechanical polishing, and the metal pillar 140 may be exposed to an outside.

With reference to FIG. 1B, the metal pillar 140 and the insulating layer 145 having passed through the chemical mechanical polishing at operation S107 may have a predetermined thickness in a direction in which they vertically get away from the one surface (e.g., upper surface of the board 105) of the board 105.

With reference to FIG. 1B, the method for manufacturing the multi-layer circuit board 100 including the extreme fine via according to an embodiment of the disclosure may further include: forming an upper metal layer 150 on one surface of the metal pillar 140 and one surface of the insulating layer 145 (S108) after completion of evenly polishing the metal pillar 140 and the insulating layer 145 (S107); forming a second resist layer 155 on one surface of the upper metal layer 150 through the photolithography process and forming a second opening 160 on the second resist layer 155 (S109); forming a plating layer 165 by plating the second opening 160 (S110); removing the second resist layer 155 (S111); and removing the upper metal layer 150 and the lower metal layer 125 (S112).

In case that the operation S107 illustrated in FIG. 1B is completed, the metal pillar 140 and the insulating layer 145 may be formed on one surface (e.g., upper surface of the board 105) of the board 105. The metal pillar 140 and the insulating layer 145 may be formed with a predetermine length in the direction in which they vertically get away from the one surface (e.g., upper surface of the board 105) of the board 105. After completion of the operation S107, operations S108 to S112 may be performed to manufacture the multi-layer circuit board 100 including the plating layer 165.

At operation S108, the upper metal layer 150 may be formed on one surface (e.g., upper surface of the metal pillar 140) of the metal pillar 140 and one surface (e.g., upper surface of the insulating layer 145) of the insulating layer 145. The upper metal layer 150 may be a layer that is formed to plate the plating layer 165 in the electrolytic plating.

With reference to FIG. 1B, the upper metal layer 150 may be formed on one surface (e.g., upper surface of the metal pillar 140) of the metal pillar 140 and on one surface (e.g., upper surface of the insulating layer 145) of the insulating layer 145 with a predetermined thickness.

According to an embodiment of the disclosure, the upper metal layer 150 may be formed in the sputtering process. The sputtering process is one of methods for forming a thin film on the surface of a target object, and forms the thin film by attaching and accumulating ions on the surface of the target object after accelerating and impacting the ions toward the target object on which the thin film is intended to be formed.

According to an embodiment of the disclosure, since the upper metal layer 150 is a layer for applying one pole of a power for plating at operation S104, it may include a material having electrical conductivity. For example, the upper metal layer 150 may be made of copper (Cu).

According to an embodiment of the disclosure, the upper metal layer 150 may be temporarily formed, and then may be removed at operation S112. Since the upper metal layer 150 may be removed at operation S112, it is preferable that the upper metal layer 150 has a thickness that is thinner than that of the plating layer 165.

At operation S109, the second resist layer 155 may be formed on one surface of the upper metal layer 150, through the photolithography process. After the second resist layer 155 is formed, the second opening 160 may be formed on the second resist layer 155.

In an embodiment, one surface of the upper metal layer 150 may be an upper surface of the upper metal layer 150, and the other surface of the upper metal layer 150 may be a lower surface of the upper metal layer 150. The second resist layer 155 may be formed on one surface (e.g., upper surface of the upper metal layer 150) of the upper metal layer 150.

In an embodiment, the second resist layer 155 may be formed in the photolithography process. The photolithography process may include a resist forming process, an exposure process, and a development process. In the resist forming process, the second resist layer 155, of which the characteristics may be changed to be easily hardened or melted when exposed to light, may be formed on the one surface (e.g., upper surface of the upper metal layer 150) of the upper metal layer 150. The second resist layer 155 may include the same material as that of the first resist layer 130. For example, the second resist layer 155 may include a dry film photoresist and a deposition material for attaching the dry film photoresist.

Through the exposure and development processes, the second opening 160 may be formed on at least a part of the second resist layer 155. In the exposure process, the light may be selectively radiated onto the second resist layer 155 after covering the second resist layer 155 with a mask on which a pattern is formed. Through the exposure process, the light may be radiated only onto the area on which the second opening 160 is formed, or the light may be radiated only onto the area on which the second opening 160 is not formed.

Through the development process, the area corresponding to the second opening 160 may be selectively removed from the second resist layer 155. The photolithography process may include an etching process for removing the remaining deposition material after the development process.

According to an embodiment of the disclosure, a plurality of second openings 160 may be formed on the second resist layer 155 through the photolithography process. With reference to FIG. 1B, at operation S109, although it is illustrated that three second openings 160 are formed, the number of the second openings 160 is not limited thereto, and three or more second openings 160 may be formed. The respective second openings 160 may be disposed at predetermined intervals.

At operation S110, the plating layer 165 may be formed on the location of the second opening 160 by using the electrolytic plating method.

According to an embodiment of the disclosure, in order to form the plating layer 165 through the electrolytic plating method, one pole of the power for plating may be applied to the upper metal layer 150, and the other pole of the power for plating may be applied to the plating material side. For example, the plating layer 165 may be formed by using the plating material, and for plating of the plating layer 165, a cathode of the power for plating may be applied to the upper metal layer 150, and an anode of the power for plating may be applied to the plating material.

According to an embodiment of the disclosure, copper (Cu) may be used as the plating material composed of the plating layer 165. It may be preferable that the plating layer 165 is made of copper (Cu) in comprehensive consideration of electrical conductivity, durability, and economical efficiency thereof.

With reference to FIG. 1B, a plurality of plating layers 165 may be formed. For example, the plurality of plating layers 165 may be formed on the location where the plurality of second openings 160 are formed in the electrolytic plating method.

With reference to FIG. 1B, the plating layer 165 may be formed on the one surface (e.g., upper surface of the upper metal layer 150) of the upper metal layer 150. For example, the plating layer 165 may be formed with a predetermined thickness on the one surface (e.g., upper surface of the upper metal layer 150) of the upper metal layer 150 on the location where the second opening 160 is formed.

At operation S111, the second resist layer 155 may be removed.

With reference to FIG. 1B, through operation S110, the plating layer 165 may be formed on the location from which a part of the second resist layer 155 is removed, and at least a part of the second resist layer 155 may remain so as to surround the plating layer 165. At operation S111, the remaining second resist layer 155 may be removed. After the second resist layer 155 is removed, the plating layer 165 may remain in the form in which the plating layer 165 protrudes in a direction in which the plating layer 165 gets far away from the one surface of the upper metal layer 150.

With reference to FIG. 1B, through operation S110, the plating layer 165 may be formed on the location of the second opening 160, and at least a part of the second resist layer 155 may remain on the one surface (e.g., upper surface of the upper metal layer 150) of the upper metal layer 150. For example, at least a part of the second resist layer 155 may be located around the plating layer 165, and may remain on the one surface (e.g., upper surface of the upper metal layer 150) of the upper metal layer 150.

At operation S111, the second resist layer 155 that remains on the one surface (e.g., upper surface of the upper metal layer 150) of the upper metal layer 150 may be removed. After the second resist layer 155 is removed, the plating layer 165 may remain with a predetermined thickness in a direction in which the plating layer 165 gets far away from the one surface (e.g., upper surface of the upper metal layer 150) of the upper metal layer 150.

At operation S112, the upper metal layer 150 and the lower metal layer 125 may be removed.

According to an embodiment of the disclosure, the removal of the upper metal layer 150 and the lower metal layer 125 may be performed by spraying the etching solution (not illustrated) on the multi-layer circuit board 110 on which operation S111 is completed. By the etching solution (not illustrated), the upper metal layer 150 and the lower metal layer 125 may be removed from the multi-layer circuit board 100 through a chemical reaction.

The upper metal layer 150 and the lower metal layer 125 may be formed with a thickness that is thinner than that of the lower conductive layer 120 or the plating layer 165. The lower conductive layer 120 and the plating layer 165 may remain without being removed even if the upper metal layer 150 and the lower metal layer 125 are removed through the etching solution (not illustrated).

Figure 2:
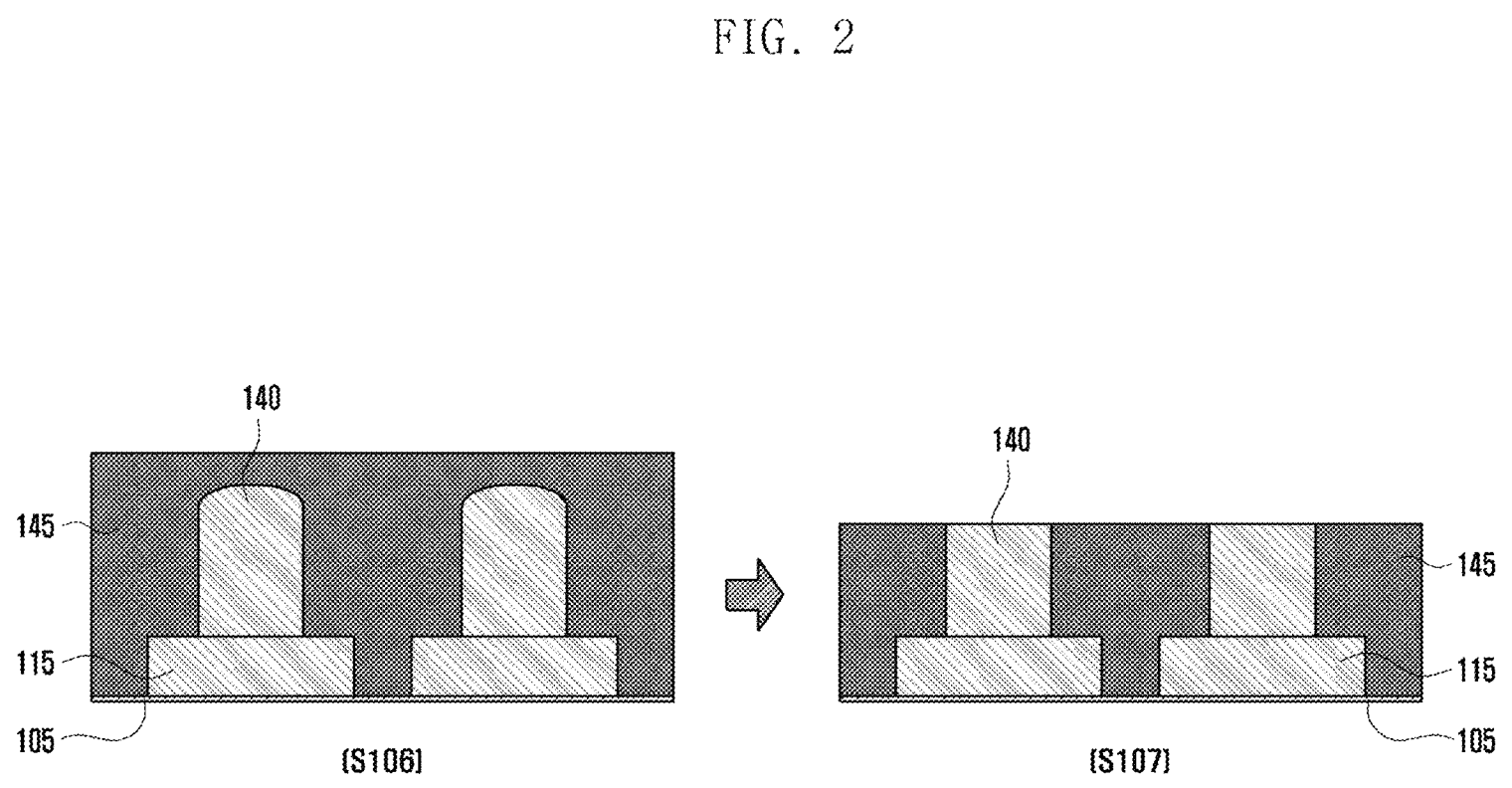

FIG. 2 is an explanatory view illustrating a process for planarization of an insulating layer 145 and a metal pillar 140 through a chemical mechanical polishing process according to an embodiment of the disclosure.

With reference to FIG. 2, the insulating layer 145 may be formed on the location from which the first resist layer 130 has been removed. At operation S105 (refer to FIG. 1B), the first resist layer 130 may be removed, and at operation S106, the insulating layer 145 may be formed on the location from which the first resist layer 130 has been removed.

In an embodiment, the upper conductive layer 115 and the lower conductive layer 120 (refer to FIG. 1B) may be located on at least a part of the board 105. One surface of the board 105 may be an upper surface of the board 105, and the other surface of the board 105 may be a lower surface of the board 105. The upper conductive layer 115 may be located on the one surface (e.g., upper surface of the board 105) of the board 105. The lower conductive layer 120 (refer to FIG. 1B) may be located on the other surface (e.g., lower surface of the board 105) (refer to FIG. 1B) of the board 105.

According to an embodiment of the disclosure, the insulating layer 145 may be formed on the one surface (e.g., upper surface of the board 105) of the board 105 through the hot press processing.

In an embodiment, the hot press processing may be performed in a manner that an external press device (not illustrated) is located on the one surface (e.g., upper surface of the insulating layer 145) of the insulating layer 145 and the other surface (e.g., lower surface of the board 105) of the board 105, and heat and pressure are applied toward the insulating layer 145.

The insulating layer 145 may include an insulating material. With reference to FIG. 2, the insulating layer 145 may be located on the one surface (e.g., upper surface of the board 105) of the board 105, and may be formed to wrap around the metal pillar 140.

At operation S106, the metal pillar 140 may be located on at least a part of the upper conductive layer 115. For example, the metal pillar 140 may be located on at least a part of the one surface (e.g., upper surface of the upper conductive layer 115) of the upper conductive layer 115.

With reference to FIG. 2, the metal pillar 140 may be formed with a predetermine length in a direction in which the metal pillar 140 vertically gets away from the one surface (e.g., upper surface of the board 105) of the board 105. The insulating layer 145 may be formed with a predetermine length in a direction in which the insulating layer 145 vertically gets away from the one surface (e.g., upper surface of the board 105) of the board 105.

With reference to FIG. 2, the insulating layer 145 may be formed to be longer than the metal pillar 140 in the direction in which the insulating layer 145 vertically gets away from the one surface (e.g., upper surface of the substrate 105) of the substrate 105. Since the insulating layer 145 is disposed around the metal pillar 140, the metal pillar 140 may not be exposed to the outside.

With reference to FIG. 2, at operation S106, it is illustrated that the insulating layer 145 is formed with a predetermined thickness (predetermined length in a direction in which the insulating layer 145 vertically gets away from the one surface of the board 105), but is not limited thereto. The thickness of the insulating layer 145 is not constant, but may be uneven.

At operation S107, the metal pillar 140 and the insulating layer 145 may be evenly formed by polishing.

According to an embodiment of the disclosure, the metal pillar 140 may include a material having electrical conductivity, and an electrical signal may be transferred through the metal pillar 140. At operation S106, the metal pillar 140 may be disposed around the insulating layer 145, and may not be exposed to the outside. In case that the metal pillar 140 is not exposed to the outside, the electrical signal is unable to be transferred to another area through the metal pillar 140, and thus at least a part of the insulating layer 145 that surrounds the metal pillar 140 may be removed.

At operation S107, in order to remove at least a part of the insulating layer 145 disposed around the metal pillar 140, chemical mechanical polishing (CMP) may be performed.

In an embodiment, the metal pillar 140 and the insulating layer 145 may be evenly formed as being polished through the chemical mechanical polishing (CMP).

The chemical mechanical polishing (CMP) may include a process of inducing a chemical reaction by dispersing slurry including a fine abrasive on a pad. The chemical mechanical polishing (CMP) may include a mechanical polishing process in which the surface that requires a planarization process is located on the pad, and then the pad is rotated with pressure.

At operation S107, the metal pillar 140 and the insulating layer 145 according to an embodiment of the disclosure may be evenly formed through the chemical mechanical polishing. For example, the metal pillar 140 and the insulating layer 145 having passed through the chemical mechanical polishing process may have a predetermined length in a direction in which they vertically get away from the one surface (e.g., upper surface of the board 105) of the board 105.

At operation S107, at least apart of the insulating layer 145 that surrounds the metal pillar 140 may be removed through the chemical mechanical polishing, and the metal pillar 140 may be exposed to the outside. At operation S107, the metal pillar 140 may be exposed to the outside, and an electrical signal may be transferred between the metal pillar 140 and other areas.

Figure 3:
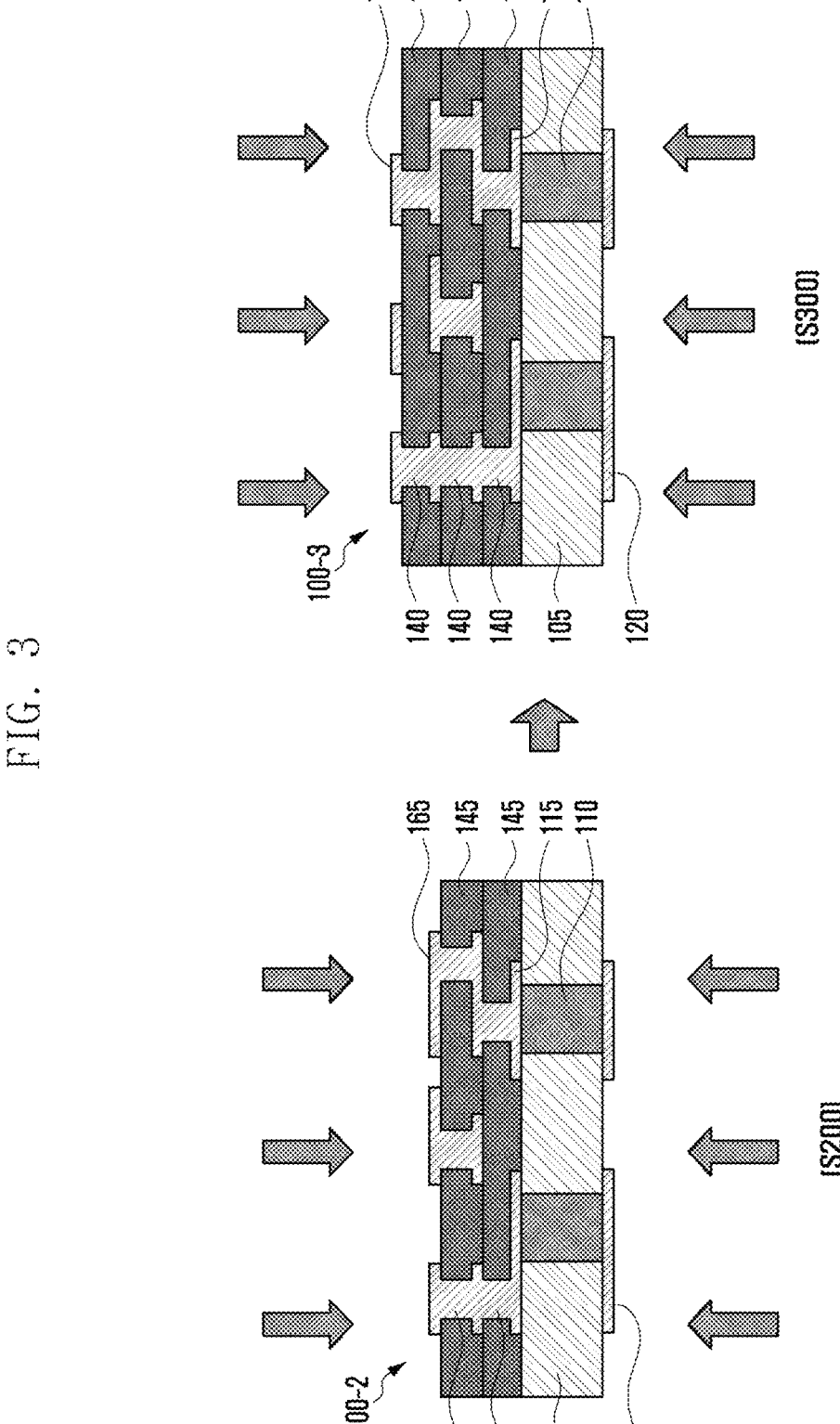
FIG. 3 is an explanatory view illustrating a laminating process of a multi-layer board according to an embodiment of the disclosure.

FIG. 3 is an explanatory view illustrating a laminating process of a multi-layer board 100 (refer to FIG. 1) according to an embodiment of the disclosure.

If operations S101 to S112 illustrated in FIG. 1 are completed, the manufacturing of the multi-layer circuit board 100 (refer to FIG. 1) including one insulating layer 145 may be completed.

If the operations S102 to S112 are repeated again multiple times after the manufacturing of the multi-layer circuit board

100 (refer to FIG. 1) including one insulating layer 145 is completed, multi-layer circuit boards (e.g., 100-1 and 100-2) including a plurality of insulating layers 145, metal pillars 140, and plating layers 165 may be manufactured.

In case that the insulating layer 145 is additionally laminated on the multi-layer circuit board 100 (refer to FIG. 1) according to an embodiment of the disclosure, the hot press processing may be performed whenever the insulating layer 145 is laminated. For example, after the lamination of the plurality of insulating layers 145 is completed, the hot press processing is not performed only once at the final operation, but may be performed whenever the plurality of insulating layers 145 are laminated.

In an embodiment, the hot press processing may be performed in a manner that an external press device (not illustrated) is located on the one surface (e.g., upper surface of the insulating layer 145) of the insulating layer 145 and the other surface (e.g., lower surface of the board 105) of the board 105, and heat and pressure are applied toward the insulating layer 145.

With reference to FIG. 3, at operation S200, the insulating layer 145 may be additionally formed on the multi-layer circuit board 100 (refer to FIG. 1) on which operations S101 to S112 have been completed. For example, after completion of the operations S101 to S112, the operations S102 to S112 illustrated in FIG. 1B may be repeatedly performed even at operation S200.

In case that the operations S102 to S112 illustrated in FIG. 1B are repeatedly performed even at operation S200, the insulating layer 145 may be additionally laminated on one surface of the multi-layer circuit board 100 (refer to FIG. 1) illustrated in FIG. 1. The insulating layer 145 may be bonded to the one surface of the multi-layer circuit board 100 (refer to FIG. 1) through the hot press processing.

The multi-layer circuit board 100-2 manufactured through completion of operation S200 may include the board 105, the via hole 110, the upper conductive layer 115, the lower conductive layer 120, the metal pillar 140, the insulating layer 145, and/or the plating layer 165. The multi-layer circuit board 100-2 manufactured through completion of the operation S200 may include two insulating layers 145.

With reference to FIG. 3, at operation S300, the insulating layer 145 may be additionally formed on the multi-layer circuit board 100-2 on which the operation S200 has been completed. The insulating layer 145 may be bonded to the one surface of the multi-layer circuit board 100-2 through the hot press processing.

The multi-layer circuit board 100-3 manufactured through completion of the operation S300 may include the board 105, the via hole 110, the upper conductive layer 115, the lower conductive layer 120, the metal pillar 140, the insulating layer 145, and/or the plating layer 165. The multi-layer circuit board 100-3 manufactured through completion of the operation S300 may include three insulating layers 145.

In an embodiment, one surface of the board 105 included in the multi-layer circuit board 100-3 may be the upper surface of the board 105, and the other surface of the board 105 may be the lower surface of the board 105.

With reference to FIG. 3, the upper conductive layer 115 may be disposed on the one surface (e.g., upper surface of the board) of the board 105. The lower conductive layer 120 may be disposed on the other surface 9 e.g., lower surface of the board) of the board 105. The board 105 may include the via hole 110 formed on the inside of the board 105.

With reference to FIG. 3, the multi-layer circuit board 100-3 may include a plurality of insulating layers 145. The plurality of insulating layers 145 may include a plurality of metal pillars 140.

With reference to FIG. 3, the plating layer 165 may be disposed on at least parts of the plurality of insulating layers 145. One surface of each of the plurality of insulating layers 145 may be the upper surface of the insulating layer 145, and the other surface of each of the plurality of insulating layers 145 may be the lower surface of the insulating layer 145. The plating layer 165 may be disposed on the one surface (e.g., upper surface of the insulating layer 145) of each of the plurality of insulating layers 145. A plurality of plating layers 165 may be disposed on the one surface of each of the plurality of insulating layers 145.

According to an embodiment of the disclosure, a method for manufacturing a multi-layer circuit board 100 including an extreme fine via may include: providing a board 105 having one surface on at least a part of which an upper conductive layer 115 is formed and the other surface on at least a part of which a lower conductive layer 120 is formed (S101); forming a lower metal layer 125 on the other surface of the board 105 (S102); forming a first resist layer 130 on the one surface of the board 105 through a photolithography process, and forming a first opening 135 on the first resist layer 130 (S103); forming a metal pillar 140 by plating the first opening 135 by using an electrolytic plating method (S104); removing the first resist layer 130 (S105); forming an insulating layer 145 on a location from which the first resist layer 130 is removed (S106); and evenly polishing the metal pillar 140 and the insulating layer 145 (S107).

In an embodiment, the method for manufacturing the multi-layer circuit board 100 may further include forming an upper metal layer 150 on one surface of the metal pillar 140 and one surface of the insulating layer 145 (S108) after completion of evenly polishing the metal pillar 140 and the insulating layer 145 (S107).

In an embodiment, the method for manufacturing the multi-layer circuit board 100 may further include: forming a second resist layer 155 on one surface of the upper metal layer 150 through the photolithography process and forming a second opening 160 on the second resist layer 155 (S109) after completion of forming the upper metal layer 150 on the one surface of the metal pillar 140 and the one surface of the insulating layer 145 (S108); forming a plating layer 165 by plating the second opening 160 (S110); and removing the second resist layer 155 (S111).

In an embodiment, the method for manufacturing the multi-layer circuit board 100 may further include removing the upper metal layer 150 exposed to outside and the lower metal layer 125 exposed to the outside (S112) after completion of removing the second resist layer 155 (S111).

In an embodiment, forming the metal pillar 140 by plating the first opening 135 by using the electrolytic plating method (S104) may form the metal pillar 140 by applying one pole of a power for plating to the lower metal layer 125 and applying the other pole of the power for plating to a plating material side.

In an embodiment, forming the plating layer 165 by plating the second opening 160 (S110) may form the plating layer 165 by applying one pole of a power for plating to the upper metal layer 150 and applying the other pole of the power for plating to a plating material side.

In an embodiment, the metal pillar 140 may be made of copper (Cu).

In an embodiment, the lower metal layer 125 may be made of copper (Cu).

In an embodiment, the plating layer 165 and the upper metal layer 150 may be made of copper (Cu).

In an embodiment, evenly polishing the metal pillar 140 and the insulating layer 145 (S107) may evenly polish the metal pillar 140 and the insulating layer 145 through chemical mechanical polishing.

In an embodiment, forming the insulating layer 145 on the location from which the first resist layer 130 is removed (S106) may bond the insulating layer 145 to the board 105 through hot press processing.

In an embodiment, forming the lower metal layer 125 on the other surface of the board 105 (S102) may form the lower metal layer 125 through a sputtering process.

In an embodiment, forming the upper metal layer 150 on the one surface of the metal pillar 140 and the one surface of the insulating layer 145 (S108) may form the upper metal layer 150 through a sputtering process.

In an embodiment, removing the upper metal layer 150 exposed to the outside and the lower metal layer 125 exposed to the outside (S112) may remove the lower metal layer 125 and the upper metal layer 150 by an etching solution.

In an embodiment, the lower metal layer 125 may have a thickness that is thinner than that of the lower conductive layer 120.

In an embodiment, the upper metal layer 150 may have a thickness that is thinner than that of the plating layer.

According to an embodiment of the disclosure, a multi-layer circuit board 100 including an extreme fine via may be manufactured by a method for manufacturing a multi-layer circuit board, which includes: providing a board 105 having one surface on at least a part of which an upper conductive layer 115 is formed and the other surface on at least a part of which a lower conductive layer 120 is formed (S101); forming a lower metal layer 125 on the other surface of the board 105 (S102); forming a first resist layer 130 on the one surface of the board 105 through a photolithography process, and forming a first opening 135 on the first resist layer 130 (S103); forming a metal pillar 140 by plating the first opening 135 by using an electrolytic plating method (S104); removing the first resist layer 130 (S105); forming an insulating layer 145 on a location from which the first resist layer 130 is removed (S106); and evenly polishing the metal pillar 140 and the insulating layer 145 (S107).

In an embodiment, the multi-layer circuit board 100 may be manufactured by the method for manufacturing the multi-layer circuit board 100, which further includes forming an upper metal layer 150 on one surface of the metal pillar 140 and one surface of the insulating layer 145 (S108) after completion of evenly polishing the metal pillar 140 and the insulating layer 145 (S107).

In an embodiment, the multi-layer circuit board 100 may be manufactured by the method for manufacturing the multi-layer circuit board 100, which further includes: forming a second resist layer 155 on one surface of the upper metal layer 150 through the photolithography process and forming a second opening 160 on the second resist layer 155 (S109) after completion of forming the upper metal layer 150 on the one surface of the metal pillar 140 and the one surface of the insulating layer 145 (S108); forming a plating layer 165 by plating the second opening 160 (S110); and removing the second resist layer 155 (S111).

In an embodiment, the multi-layer circuit board 100 may be manufactured by the method for manufacturing the multi-layer circuit board 100, which further includes: removing the upper metal layer 150 exposed to outside and the lower metal layer 125 exposed to the outside (S112) after completion of removing the second resist layer 155 (S111).

Although embodiments of the disclosure have been disclosed, the disclosure is not necessarily limited thereto, but any modifications and alterations are possible within the range of the technical idea of the disclosure.

What is claimed is:

1. A method for manufacturing a multi-layer circuit board comprising an extreme fine via, the method comprising:

providing a board comprising:

one surface on at least a part of which an upper conductive layer is formed; and an other surface on at least a part of which a lower conductive layer is formed;

forming a lower metal layer on the other surface of the board;

forming a first resist layer on the one surface of the board through a photolithography process, and forming a first opening on the first resist layer;

forming a metal pillar comprising a diameter of 14 μm to 25 μm by plating the first opening by using an electrolytic plating method;

removing the first resist layer;

forming an insulating layer on a location from which the first resist layer is removed;

evenly polishing the metal pillar and the insulating layer;

forming an upper metal layer on one surface of the metal pillar and one surface of the insulating layer after completion of the evenly polishing the metal pillar and the insulating layer;

forming a second resist layer on one surface of the upper metal layer through the photolithography process and forming a second opening on the second resist layer;

forming a plating layer by plating the second opening;

removing the second resist layer; and removing the upper metal layer exposed to outside and the lower metal layer exposed to the outside, wherein the metal pillar is one of a plurality of metal pillars arranged such that an interval between centers of each of the plurality of metal pillars is 30 μm to 50 μm.

2. The method of claim 1, wherein forming the metal pillar by plating the first opening by using the electrolytic plating method comprises forming the metal pillar by applying one pole of a power for plating to the lower metal layer and applying the other pole of the power for plating to a plating material side.

3. The method of claim 1, wherein forming the plating layer by plating the second opening comprises forming the plating layer by applying one pole of a power for plating to the upper metal layer and applying the other pole of the power for plating to a plating material side.

4. The method of claim 1, wherein the metal pillar is made of copper (Cu).

5. The method of claim 1, wherein the lower metal layer is made of copper (Cu).

6. The method of claim 1, wherein the plating layer and the upper metal layer are made of copper (Cu).

7. The method of claim 1, wherein evenly polishing the metal pillar and the insulating layer comprises evenly polishing the metal pillar and the insulating layer through chemical mechanical polishing.

8. The method of claim 1, wherein forming the insulating layer on the location from which the first resist layer is removed comprises bonding the insulating layer to the board through hot press processing.

9. The method of claim 1, wherein forming the lower metal layer on the other surface of the board comprises forming the lower metal layer through a sputtering process.

10. The method of claim 1, wherein forming the upper metal layer on the one surface of the metal pillar and the one surface of the insulating layer comprises forming the upper metal layer through a sputtering process.

11. The method of claim 1, wherein removing the upper metal layer exposed to the outside and the lower metal layer exposed to the outside comprises removing the lower metal layer and the upper metal layer by an etching solution.

12. The method of claim 1, wherein the lower metal layer has a thickness that is thinner than that of the lower conductive layer.

13. The method of claim 1, wherein the upper metal layer has a thickness that is thinner than that of the plating layer.

* * * * *